(12) United States Patent
Yoon

(10) Patent No.: US 7,484,155 B2
(45) Date of Patent: Jan. 27, 2009

(54) ANALOG BASE-BAND TEST APPARATUS AND METHOD BY ENHANCED COMBINATION OF JTAG AND MEMORY IN MOBILE COMMUNICATION SYSTEM

(75) Inventor: Seong-Ho Yoon, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 275 days.

(21) Appl. No.: 11/324,707

(22) Filed: Jan. 3, 2006

(65) Prior Publication Data

US 2006/0150038 A1 Jul. 6, 2006

(30) Foreign Application Priority Data

Jan. 4, 2005 (KR) .................. 10-2005-0000563

(51) Int. Cl.
*G01R 31/28* (2006.01)

(52) U.S. Cl. .............. 714/738; 375/224; 375/219; 370/249; 714/712; 714/716; 704/230

(58) Field of Classification Search ............... None
See application file for complete search history.

(56) References Cited

U.S. PATENT DOCUMENTS

| | | | | |
|---|---|---|---|---|
| 5,148,435 A | * | 9/1992 | Ray et al. ............. | 714/716 |
| 5,210,703 A | * | 5/1993 | Hodgson .............. | 398/33 |
| 6,175,939 B1 | * | 1/2001 | Dinteman ............. | 714/724 |
| 6,298,458 B1 | * | 10/2001 | Cranford et al. ...... | 714/716 |
| 6,425,101 B1 | | 7/2002 | Garreau | |
| 6,977,960 B2 | * | 12/2005 | Takinosawa .......... | 375/224 |
| 7,093,172 B2 | * | 8/2006 | Fan et al. ............. | 714/716 |
| 7,127,391 B2 | * | 10/2006 | Chang et al. ......... | 704/230 |
| 7,174,488 B1 | * | 2/2007 | Chu ................... | 714/712 |
| 7,254,755 B2 | * | 8/2007 | de Obaldia et al. ..... | 714/715 |
| 2002/0108080 A1 | * | 8/2002 | Mori et al. ........... | 714/742 |
| 2003/0035473 A1 | * | 2/2003 | Takinosawa .......... | 375/224 |
| 2003/0074618 A1 | | 4/2003 | Dorsey | |
| 2004/0076119 A1 | * | 4/2004 | Aronson et al. ....... | 370/249 |
| 2005/0286616 A1 | * | 12/2005 | Kodavati .............. | 375/219 |

FOREIGN PATENT DOCUMENTS

| | | |
|---|---|---|
| JP | 08114647 | 5/1996 |
| JP | 11083949 | 3/1999 |
| JP | 20020335231 | 11/2002 |
| JP | 20030228999 | 8/2003 |
| KR | 1020010010032 | 2/2001 |
| KR | 20200220078 | 7/2002 |

* cited by examiner

*Primary Examiner*—Jacques Louis-Jacques
*Assistant Examiner*—Steven D Radosevich
(74) *Attorney, Agent, or Firm*—F. Chau & Associates, LLC

(57) ABSTRACT

An analog base-band (ABB) chipset of a mobile communication system comprises a memory configured to store a test pattern, a test control unit configured to generate a control signal during a test mode, an ABB unit configured to perform a test operation by receiving the test pattern from the memory in response to the test control signal and to output data of the test pattern to the memory in response to the test control signal, and a path selection circuit configured to form a flow path of the test pattern in the ABB unit in response to the test control signal.

11 Claims, 2 Drawing Sheets

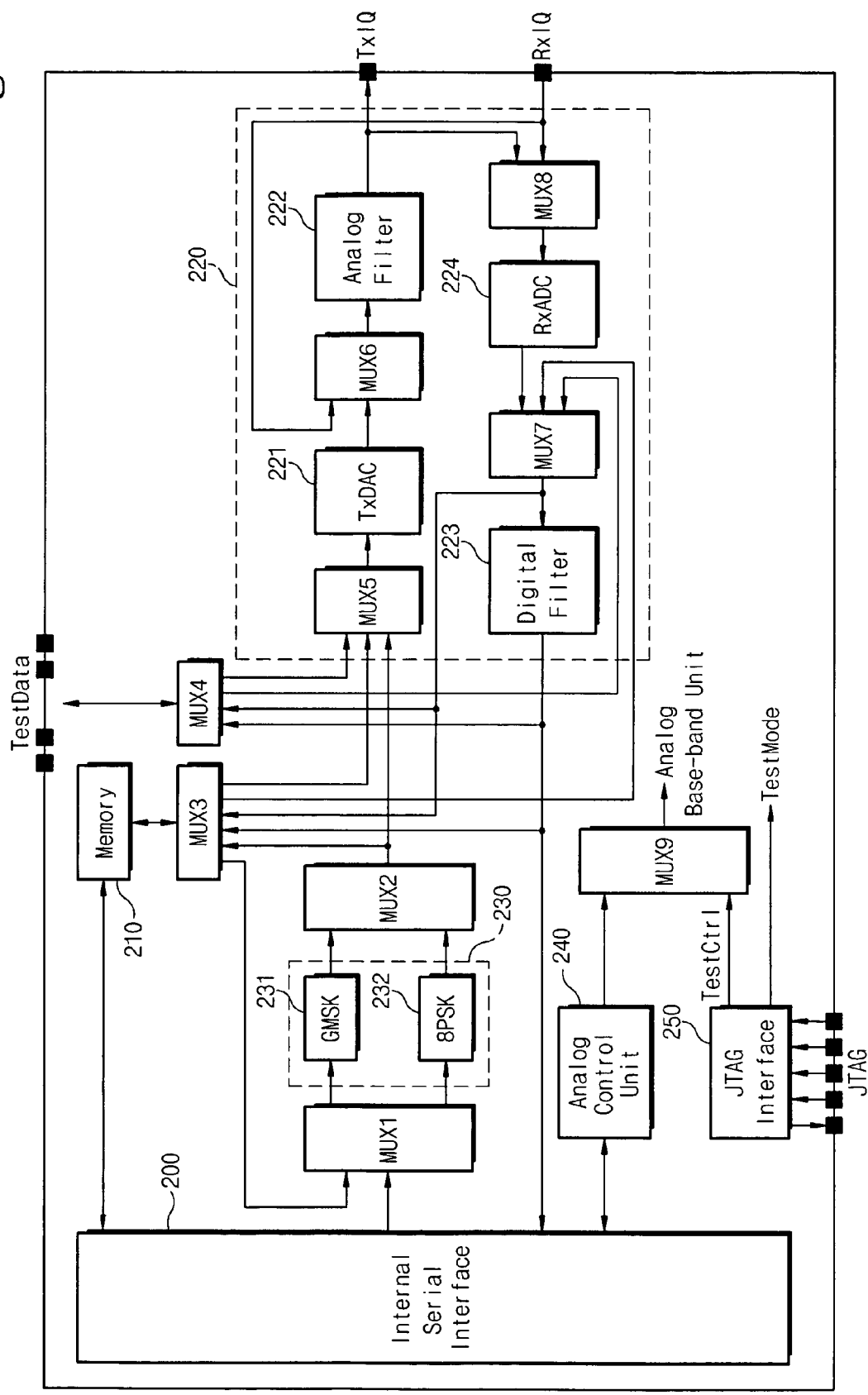

ANALOG BASE-BAND TEST APPARATUS AND METHOD BY ENHANCED COMBINATION OF JTAG AND MEMORY IN MOBILE COMMUNICATION SYSTEM

CROSS-REFERENCE TO RELATED APPLICATION

The present application claims the benefit of Korean Patent Application No. 2005-00563, filed Jan. 4, 2005 and hereby incorporated by reference herein in its entirety.

BACKGROUND OF THE INVENTION

1. Field of the Invention

The present invention relates to test methods for mobile communication systems and, more particularly, to a method of testing the performance and characteristics of an analog base-band (ABB) chipset operated in a base-band frequency domain.

2. Description of the Related Art

In general, digital mobile communication terminals have a chipset, called an ABB chipset, performing a function of converting and filtering intermediate frequency signals and base-band analog and digital signals. Also, this ABB chipset converts an intermediate frequency analog signal into a digital signal in global system for mobile communications (GSM)/enhanced data rates for GSM evolution (EDGE) mode or code division multiple access (CDMA) mode and converts base-band data to be transmitted into an analog signal. This ABB chipset is an essential component of a mobile communication terminal, and its operations should be tested. Due to a difference in test environments, such as a lab test environment or an automatic test equipment (ATE) test environment, and considering test apparatus and economic conditions, there are testing limitations. In a lab test environment, it is difficult to satisfy various test modes because of the high-cost of ATE. In the case of the ABB chipset, various test patterns should be applied, and a large number of additional equipment is required to obtain proper results. Accordingly, it is difficult to satisfy all test modes by the use of an ATE test.

FIG. 1 is a block diagram illustrating a conventional test method of an analog base-band chipset of a mobile communication terminal. Referring to FIG. 1, the analog base-band (ABB) chipset comprises a digital unit 10 generating digital data and performing and processing a digital modulation, multiplexers 30 and 40 determining a test mode according to a test mode selection signal, an ABB unit 20 processing an analog signal, a test data input/output (I/O) terminal TestData in which a test pattern to be tested is input, a test mode selection terminal TestMode for selecting a test mode, and a test control terminal TestCtrl for controlling the test apparatus in selecting the test mode.

The ABB unit 20 includes a digital-to-analog converter (DAC) 21 converting digital data into an analog signal, an analog-to-digital converter (ADC) 22 converting a received analog signal into digital data, an analog filter 23 filtering analog signals, and a codec 24 converting a received digital sound into an analog signal or an input analog sound into digital data.

In the above-mentioned structure, test data is applied by the ATE test, a test mode is determined by the ATE test, and a test control signal is applied externally. Since pins are structured for various test modes and for controlling the test operation, the number of pins is increased, and the complexity of the process is increased. In the lab test environment, there is a limitation such that various test patterns, e.g., the ATE test, are directly applied to an ABB chipset. This means that it is difficult to predict defects of the ABB chipset that may be generated during its manufacturing process. These defects result in high costs and inefficiencies. In a conventional chipset structure, it is difficult to satisfy the desired accuracy and performance of the test operation in the lab test environment as well as in the ATE test environment.

SUMMARY OF THE INVENTION

In exemplary embodiments of the present invention, an analog base-band (ABB) chipset of a mobile communication system capable of testing its performance in a lab test environment like an automatic test equipment (ATE) test environment is provided.

In further embodiments, the ABB chipset comprises an internal serial interface capable of inputting a test pattern therein, a memory configured to store the input test pattern through the internal serial interface, a joint test action group (JTAG) interface added to an integrated circuit for boundary scan test of the ABB chipset, a multiplexer configured to select a continuous stream of a signal according to a test mode, and an ABB unit in which an analog signal is processed.

In additional embodiments of the present invention, the memory further includes a memory controller for controlling a series of operations as followings. The memory controller reads and stores data from the internal serial interface, transmits the stored data to the ABB unit, and stores test result signal of the ABB unit.

In an ABB chipset test apparatus, a kind of test and a test condition are set by applying a test mode and a test control signal through a JTAG program in an ATE test environment. In a lab test environment, the test mode and the test control signal are applied through the JTAG program, and a test pattern is stored through the internal serial interface in the memory. If the test operation begins, the test pattern is input to the ABB unit, and then the tested signal is stored in the memory again. Through the effective combination of the internal memory and the JTAG interface, the ABB chipset test apparatus is capable of testing its performance in the lab test environment like the ATE test environment.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 2 is a block diagram illustrating an analog base-band chipset of a mobile communication terminal according to the present invention.

DETAILED DESCRIPTION OF EXEMPLARY EMBODIMENTS

Figure 1:
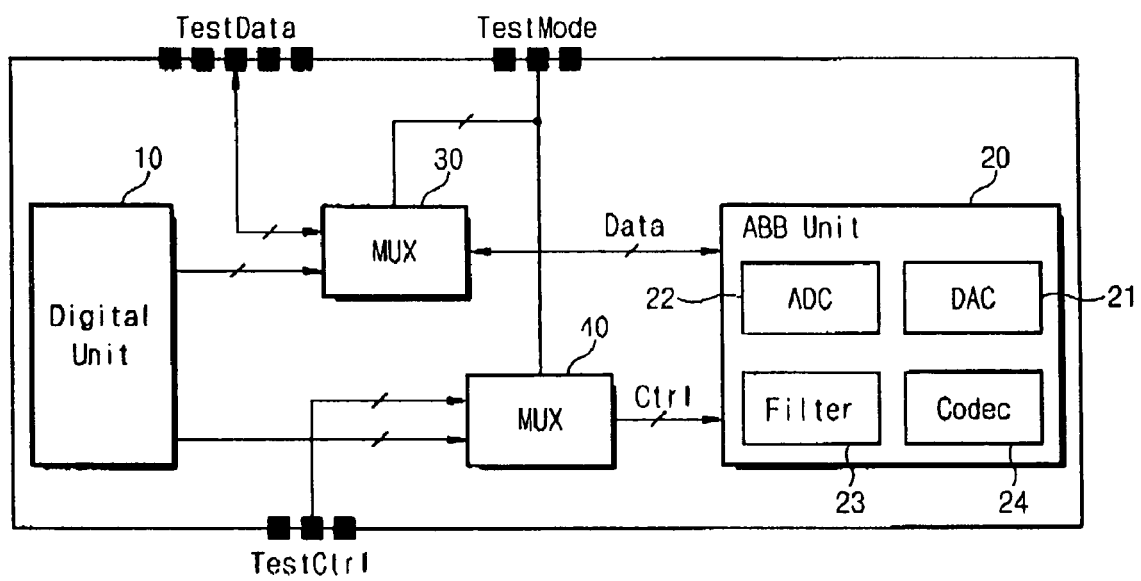
FIG. 1 is a block diagram illustrating a conventional test method of an analog base-band chipset of a mobile communication terminal.

Specific exemplary embodiments of the invention will be described with reference to the accompanying drawings. An analog base-band (ABB) chipset of a digital mobile communication system is a typical example of a chipset embodied to support global system for mobile communications (GSM)/enhanced data rates for GSM evolution (EDGE) mode.

The elements illustrated herein are for the purpose of describing particular embodiments only and are not intended to be limiting of the invention.

FIG. 2 is a block diagram illustrating an analog base-band chipset of a mobile communication terminal according to the present invention. Referring to FIG. 2, a test apparatus of the present invention comprises an internal serial interface 200 configured to communicate with an external chipset, a memory 210 configured to store a test pattern or tested data in response to a predetermined control signal, an ABB unit 220 configured to perform a series of analog operations, a digital modulator 230 configured to perform a digital modulation according to a communication mode, a control unit 240 configured to control an analog operation 240, and a joint test action group (JTAG) interface 250 configured to generate a test mode and a test control signal through a JTAG program.

The internal serial interface 200 is a serial bus interface block embedded in the chipset of an integrated circuit. Also, the internal serial interface 200 provides a communication means for controlling and testing operations of chipset elements from external test apparatus and test apparatus.

The memory 210 stores various test patterns input by the internal serial interface 200 and supplies the test patterns to an apparatus to be tested in response to a memory control signal. Additionally, when the test operation is complete, the memory 210 receives and stores test data from the tested apparatus. The test data may be output by the internal serial interface 200. These operations of the memory are carried out in response to the memory control signal input through the internal serial interface 200.

The ABB unit 220 comprises a transmitting digital-to-analog converter (TxDAC) 221 configured to convert transmitted data into an ABB signal, an analog filter 222 configured to filter the ABB signal from the TxDAC 221 to remove harmonic frequencies, a receiving analog-to-digital converter (RxADC) 224 configured to convert a received ABB signal into digital data, and a digital filter 223 configured to filter the digital data output from the RxADC 224.

In testing the ABB chipset, the test pattern with the above-mentioned construction is applied to the TxDAC 221 in the ABB unit 220 or the digital filter 223, and as a result, data is obtained. In this case, the test result is obtained by fetching and analyzing data that is responded by the digital filter 223 included in the ABB unit 220 and the test pattern of the RxADC 224. Through these processes, various characteristics and performances such as frequency response characteristics, delay characteristics, quantizing error characteristics, and a degree of filters can be measured.

The digital modulator 230 maps data to be transmitted according to a communication mode. In the present invention, the digital modulator 230 includes a GMSK modulator 231 and an 8PSK modulator 232. Accordingly, these two modulation modes can be selected depending on a determination of the test mode.

The analog control unit 240 controls elements of the ABB unit in response to a control signal input by the internal serial interface 200. Also, the analog control unit 240 controls characteristics of the elements of the ABB unit 220 during conventional operation (not the test mode).

The JTAG interface 250 includes five terminals, e.g., a test clock input (TCK), a test mode select (TMS), test data output (TDI), treat reset (TRST), which are interfaces connected to the JTAG during a debugging operation. These five pins are connected to the JTAG interface 250 in the chip and capable of testing and controlling the chip by a JTAG line. The JTAG interface 250 performs a function for boundary scan test with respect to blocks inside the chip. However, the JTAG interface is limited to select a test mode by an external JTAG program and apply a test control signal TestCtrl to the ABB unit 220. It is advantageous to dramatically reduce the number of pins, which are constructed on the exterior so as to apply a conventional test mode and a test control signal. The test mode signal TestMode selects a kind of test patterns and a test path by blocks in the ABB unit 220. Owing to the test control signal, a sampling frequency of the TxDAC 221 and RxADC 224 in the ABB unit 220, a clock, and tab coefficients of the digital filter 223 can be controlled, and test variables are also controlled.

First through ninth multiplexers MUX1-MUX9 select paths that are input or output to blocks in response to the test mode signal TestMode output from the JTAG interface 250. They are included in the digital modulator 230, the ABB unit 220, the memory 212, an I/O terminal of an external test pattern TestData, and an output terminal of the JTAG interface 250.

The first multiplexer MUX1 selects whether an input signal of the digital modulator 230 is input from an internal serial interface 200 or the memory by the test mode TestMode being an output signal of the JTAG interface 250.

The second multiplexer MUX2 selects a digital modulation mode of data for performing a test operation by the test mode TestMode being an output signal of the JTAG interface 250.

The third multiplexer MUX3 selects whether the test pattern of the memory is output to any block, and any apparatus receives the tested data or not by the test mode TestMode.

The fourth multiplexer MUX4 outputs a test pattern input by an external apparatus in an ATE test environment to a designated apparatus according to the test mode TestMode being an output signal of the JTAG interface 250. Also, the fourth multiplexer MUX4 selects the test result to an external apparatus.

The fifth multiplexer MUX5 selects whether a test operation is carried out by which of a storage test pattern of the memory during a lab test environment or an external input pattern during an ATE test environment in response to digital modulation data output from the digital modulator 230 together with the test mode signal TestMode of the JTAG interface.

The sixth multiplexer MUX6 selects one of an analog signal of a test pattern converted by the TxDAC 221 and another analog signal of a receiving signal of a receiver through the test mode TestMode being the output signal of the JTAG interface 250.

The seventh multiplexer MUX7 selects one of output digital data of RxADC 224 and whether a test operation is carried out by any input test pattern through the test mode TestMode being the output signal of the JTAG interface 250 in testing a performance of the digital filter 223.

The eighth multiplexer MUX8 selects to receive an output analog signal of the analog filter generated from an internal test pattern or a received signal of the receiver through the test mode TestMode being the output signal of the JTAG interface 250.

The ninth multiplexer MUX9 selects a test control signal output from the JTAG interface 250 and controls each of elements of the ABB unit 220 by selecting the test mode TestMode.

Accordingly, the multiplexers have various paths according to the test mode TestMode, respectively and perform a test operation by blocks in the ABB unit 220. In addition, they select various test patterns irrespective of the same block to control a flow of the signal so as to perform the test operation.

In brief, according to the above-mentioned tests, a test pattern is input through the internal serial interface 200 to the memory so as to verify a performance of each of elements of the ABB unit 220, and one of the test mode TestMode and the test control signal TestCtrl is determined through the JTAG interface 250 during a lab test environment. According to the determined test mode, the multiplexers included in the I/O terminals of elements select an I/O line. The frequency band and tab coefficients of the ABB unit are determined by the test control signal. Once a test operation starts, a test pattern is input from the memory to the ABB unit. Then, a predetermined signal is processed via a path selected by the test mode, and the output data is stored in the memory again.

On the other hand, during the ATE test environment, a test mode and a test control signal are input through a JTAG programming. A test pattern is connected to an ATE apparatus to be input. According to the test mode, the tested data is output to the ATE apparatus again. As a result, it is possible to measure characteristics and performances of the ABB chipset. The test mode and the test control signal are created by the JTAG interface, thereby reducing the number of pins of the chipset.

As previously mentioned, the ABB test apparatus of the mobile communication system further includes the JTAG interface and the memory. The JTAG interface is capable of selecting a test mode and applying a test control signal in the chipset, and the memory is capable of storing tested data by the test pattern. For this reason, the ABB test apparatus of a mobile communication system can extend a test range in a lab environment. Furthermore, they are capable of collectively inputting the test control signal as well as a mode selection signal together with a JTAG terminal, thereby reducing the number of pins in the ATE test environment. The ABB chipset of the mobile communication system is capable of testing its performance in the lab test environment like an ATE test environment. As a result, the test operation is carried out more exactly, and it is possible to acknowledge defects before manufacturing products and minimize economic loss.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An analog base-band (ABB) chipset in a mobile communication system, comprising:
   a memory configured to store a test pattern and test data;
   a test control unit configured to generate a test control signal during a test mode;
   an ABB unit configured to perform a test operation by receiving the test pattern from the memory and to output test data to the memory; and
   a path selection circuit configured to form a flow path for the test pattern in the ABB unit, wherein the ABB unit comprises:
   a transmitting digital-to-analog converter (TxDAC) configured to convert transmitted data into an ABB signal;
   an analog filter configured to filter the ABB signal from the TxDAC to remove harmonic frequencies;
   a receiving analog-to-digital converter (RxADC) configured to convert a received ABB signal into digital data; and
   a digital filter configured to filter the digital data output from the RxADC, wherein the path selection circuit comprises:
   a first multiplexer configured to determine an input of the TxDAC in response to the test control signal;
   a second multiplexer configured to determine a kind of an input of the analog filter in response to the test control signal;
   a third multiplexer configured to determine an input of the RxADC in response to the test control signal; and
   a fourth multiplexer configured to determine an input of the digital filter in response to the test control signal.

2. The ABB chipset of claim 1, wherein the first multiplexer selects one of a test pattern stored in the memory in response to a test signal and a test pattern supplied by an additional device in the exterior of the ABB chipset.

3. The ABB chipset of claim 1, wherein the second multiplexer selects an output of the TxDAC during a test mode.

4. The ABB chipset of claim 1, wherein the third multiplexer selects an output of the analog filter during a test mode.

5. The ABB chipset of claim 1, wherein the fourth multiplexer selects one of an output of the RxADC in response to the test control signal, a test pattern of the memory, and an externally input test pattern, and inputs the selection to the digital filter.

6. An analog base-band (ABB) chipset in a mobile communication system, comprising:
   a memory to store a test pattern and test data;
   a test control unit to generate a test control signal during a test mode;
   an ABB unit to perform a function of converting and filtering intermediate frequency signals and base-band signals and to perform a test operation by receiving a test pattern from the memory and to output test data to the memory; and
   a path selection circuit to form a flow path for the test pattern in the ABB unit, wherein the ABB unit comprises:
   a digital-to-analog converter (DAC) to convert input data into an analog signal;
   an analog filter to filter the analog signal to a base band;
   an analog-to-digital converter (ADC) to convert an analog signal selected by the path selection circuit into a digital signal during a test mode;
   and a digital filter to filter data selected by the path selection circuit during a test mode, wherein the path selection circuit comprises:
   a first multiplexer to determine an input of the DAC in response to the test control signal;
   a second multiplexer to determine a kind of an input of the analog filter in response to the test control signal;
   a third multiplexer to determine an input of the ADC in response to the test control signal; and
   a fourth multiplexer to determine an input of the digital filter in response to the test control signal.

7. The ABB chipset of claim 6, wherein the first multiplexer selects one of a test pattern stored in the memory in response to a test signal and a test pattern supplied by an additional device in the exterior of the ABB chipset.

8. The ABB chipset of claim 6, wherein the second multiplexer selects an output of the DAC during a test mode.

9. The ABB chipset of claim 6, wherein the third multiplexer selects an output of the analog filter during a test mode.

10. The ABB chipset of claim 6, wherein the fourth multiplexer selects one of an output of the ADC in response to the test control signal, a test pattern in the memory, and an externally input test pattern, and inputs the selection to the digital filter.

11. An analog base-band (ABB) chipset in a mobile communication system, comprising:

a memory to store a test pattern and test data;

a test control unit to generate a test control signal during a test mode;

an ABB unit to perform a function of converting and filtering intermediate frequency signals and base-band signals and to perform a test operation by receiving the test pattern from the memory and to output test data to the memory; and a path selection circuit to form a flow path for the test pattern in the ABB unit, wherein the path selection circuit comprises:

a first multiplexer to determine an input of a digital-to-analog converter in the ABB unit in response to the test control signal;

a second multiplexer to determine a kind of an input of an analog filter in the ABB unit in response to the test control signal;

a third multiplexer to determine an input of an analog-to-digital converter in the ABB unit in response to the test control signal; and a fourth multiplexer to determine an input of a digital filter in the ABB unit in response to the test control signal.

* * * * *